(12) United States Patent
Komurasaki et al.

(10) Patent No.: US 8,535,809 B2
(45) Date of Patent: Sep. 17, 2013

(54) ELECTRICAL INSULATING RESIN COMPOSITION, AND LAMINATE FOR CIRCUIT BOARD

(75) Inventors: Hideto Komurasaki, Kanagawa (JP); Tomoyuki Itou, Kanagawa (JP); Nobuaki Koyama, Kanagawa (JP); Kouichi Kusakawa, Kanagawa (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 1153 days.

(21) Appl. No.: 11/115,400

(22) Filed: Apr. 27, 2005

(65) Prior Publication Data

US 2005/0276958 A1    Dec. 15, 2005

(30) Foreign Application Priority Data

Apr. 28, 2004  (JP) ................. 2004-134179
Apr. 28, 2004  (JP) ................. 2004-134180

(51) Int. Cl.
   *B32B 15/08*   (2006.01)
(52) U.S. Cl.
   USPC ................. 428/457; 428/458; 428/462
(58) Field of Classification Search
   None
   See application file for complete search history.

(56) References Cited

U.S. PATENT DOCUMENTS

| | | | | |
|---|---|---|---|---|
| 4,323,637 A | * | 4/1982 | Chen et al. | 430/271.1 |
| 5,096,800 A | * | 3/1992 | Yuasa et al. | 430/286.1 |
| 6,211,320 B1 | * | 4/2001 | Dershem et al. | 526/329.1 |

FOREIGN PATENT DOCUMENTS

| | | |
|---|---|---|
| JP | 60-028418 A | 2/1985 |
| JP | 03-166256 A | 7/1991 |
| JP | 07-182921 A | 7/1995 |
| JP | 8-208856 | 8/1996 |
| JP | 10-242606 | 9/1998 |
| JP | 11-8450 | 1/1999 |
| JP | 2001-81429 | 3/2001 |
| JP | 2002-322229 A | 11/2002 |
| JP | 2003-286384 A | 10/2003 |
| JP | 2003-313235 A | 11/2003 |
| WO | WO-03/035705 A1 | 5/2003 |

OTHER PUBLICATIONS

Notice of Rejection mailed on Jun. 16, 2009, issued on the corresponding Japanese application No. 2004-134179 and the English translation thereof.
Japanese Office Action dated Jan. 19, 2010 issued in the corresponding Japanese Patent Application No. 2004-134180 and English translation thereof.
Japanese Decision of Patent Grant dated Aug. 17, 2010, issued in the corresponding Japanese Patent Application No. 2004-134180 and English translation thereof.

* cited by examiner

*Primary Examiner* — Monique Jackson
(74) *Attorney, Agent, or Firm* — Edwards Wildman Palmer LLP

(57) ABSTRACT

Provided is an electrical insulating resin composition capable of forming an electrical insulating layer which has excellent flexibility and board adhesiveness, together with high thermal resistance and high humidity resistance, tolerates a high temperature treatment at soldering and can be stably used for a long time under a harsh environment with high temperature and vibration in an automobile. A resin composition containing as organic components at least a rubber like polymer compound (A) composed of a copolymer of an aromatic vinyl compound and a conjugated diene compound and a polymerizable monomer (B) having one or more terminal reactive double bonds is employed as the electrical insulating resin composition. The compound (A) may be partially hydrogenated. The composition may optionally contain an oligomer (C) having a ring structure and having a reactive unsaturated bond in the molecule thereof.

8 Claims, No Drawings

ELECTRICAL INSULATING RESIN COMPOSITION, AND LAMINATE FOR CIRCUIT BOARD

CROSS-REFERENCE TO RELATED APPLICATIONS

The present application claims the benefit of priority based on the Japanese Patent Application Nos. 2004-134179 and 2004-134180 both filed on Apr. 28, 2004, the entire disclosure of which is incorporated herein by reference.

BACKGROUND OF THE INVENTION (1) Field of the Invention

The present invention relates to an electrical insulating resin composition which may suitably be used as an electrical insulating material in a circuit board such as a printed wiring assembly, as well as an uncured sheet product, an uncured laminate for the circuit board and a cured laminate for the circuit board by the use thereof, and in particular relates to an electrical insulating resin composition capable of forming an electrical insulating layer having excellent flexibility together with high thermal resistance. More particularly, the invention relates to an electrical insulating resin composition which may suitably be used for a metal based board having high thermal radiation property and can form an electrical insulating layer which is excellent in solder temperature resistance and stably usable for a long time even under a harsh environment such as a high temperature and a high humidity.

(2) Description of the Related Art

Recently, electric home appliances, industrial instruments, office automation equipments, and in-vehicle electronic devices are required to be downsized for saving spaces, and to have some additional values. Therefore, insulating materials durable under ever-harsher temperature, humidity and electric environments have been demanded. In particular, electrical insulating materials which are excellent in electrical insulating property, dielectric strength, thermal radiation property, and connection reliability at soldered portions have been desired.

As a circuit board used under such a harsh environment, a metal based board having a metal substrate such as aluminum and copper that are well capable of radiating heat, an electrical insulating layer provided thereon, and a current-carrying circuit arranged thereon has been frequently used.

In such a metal based board, an epoxy resin is often utilized as the electrical insulating layer. However, a thermal conductivity of the epoxy resin itself is low, and thus it can not efficiently transmit the heat generated in the current-carrying circuit to the metal substrate. Thus, the thermal conductivity of the electrical insulating layer has been improved by eminently filling a thermal conductive inorganic filler in the epoxy resin.

However, when the ratio of the inorganic filler is increased for the purpose of enhancing the thermal conductivity, the flexibility of the electrical insulating layer is reduced to become fragile, and additionally adhesiveness of the electrical insulating layer to the metal substrate is also reduced. Upon performing soldering on the metal based board at high temperature of 200° C. or above, if the ratio of the inorganic filler is high, the electrical insulating layer is cracked due to the high temperature at the soldering, which has caused a decrease of the dielectric strength.

Thus, in order to improve the flexibility and the adhesiveness of the electrical insulating layer, Patent Document 1 (JP-P-H11-8450 A) discloses a metal based board using a resin composition with an elastic modulus of $2 \times 10^{10}$ Pa or less at $-40°$ C. As an example of the resin composition having such a low elastic modulus, Patent Document 1 discloses an epoxy resin in which a rubber component is dispersed. As specific examples of the epoxy resin in which the rubber component is dispersed, Patent Document 1 exemplifies a CTBN (carboxyl-terminated butadiene-acrylonitrile rubber) modified epoxy resin and an epoxy resin containing a flexible curing agent of modified polyamine. However, electrical insulating layer obtained by the use of such an epoxy resin with low elastic modulus contains ionic impurities, and thus it is inevitable to reduce electric and physical properties such as ion migration resistance and water-absorbing property in a produced circuit. A handling performance has been improved by the use of a semi-cured resin (B stage state) so that the insulating adhesive layer material of such an epoxy-curable resin is not sticky when touched with a hand at room temperature. However, a material lifetime of the insulating adhesive layer material of such an epoxy-curable resin is short in the B stage state, and management and storage thereof have been highly problematic.

Patent Document 2 (JP-P-H10-242606 A) discloses a thermal conductive adhesive composition with low elastic modulus in which acryl rubber or NBR having reactive groups such as an epoxy group and having a glass transition point of 0° C. or less and a molecular weight of 0.1 to 2 millions is added to the epoxy resin, as an insulating adhesive layer material excellent in thermal conductivity, humidity resistance, thermal resistance, insulating reliability and anti-cracking. In the same manner as the material disclosed in the Patent Document 1, handling performance has been improved by the use of a semi-cured resin (B stage state) so that the insulating adhesive layer material of such an epoxy-curable resin is not sticky when touched with a hand at room temperature. However, a material lifetime of the insulating adhesive layer material of such an epoxy-curable resin is short in the B stage state, and management and storage thereof have been highly problematic. If the resin composition described in Patent Document 2 contains the inorganic filler at a high ratio, the flexibility of the electrical insulating layer is reduced to become fragile. Thus there has been a drawback that the inorganic filler can not be eminently filled.

Patent Document 3 (JP-P-H8-208856 A) discloses a thermally curable composition containing a polybutadiene resin or a polyisoprene resin and unsaturated polybutadiene- or a polyisoprene-containing polymer as an electrical insulating layer material utilizing a radical polymerization reaction. However, in Patent Document 3, 1,2-adducts are primarily used as the polybutadiene resin or the polyisoprene resin, and unsaturated butadiene or isoprene. Therefore, a resulting cured product is very hard, and an adhesive strength to a substrate is also low.

Additionally, Patent Document 4 (JP-P-2001-81429 A) has disclosed a method for performing radical polymerization of a composition having epoxy-modified rubber, an allyl group-containing compound and a curable resin component such as bismaleimide. However, it is a major object of Patent Document 4 to provide a material having a low relative dielectric constant in order to accelerate the speed of signal processing, and therefore, the adhesiveness of a resulting electrical insulating layer is extremely low. Due to the low content of the epoxy-modified rubber, the hardness is too high to use in an application which requires flexibility. The material lacks insulation reliability because of flagrant fragility when an inorganic filler is added at a large amount. Eventually, the resulting electrical insulating layer is actually unavailable as an insulating material for thermal radiation.

The following is the list of prior art documents:
Patent Document 1: JP-P-H11-8450 A
Patent Document 2: JP-P-H10-242606 A
Patent Document 3: JP-P-H8-208856 A
Patent Document 4: JP-P-2001-81429 A

SUMMARY OF THE INVENTION

The present invention has been made in the light of the above, and it is an object of the invention to provide an electrical insulating resin composition capable of forming an electrical insulating layer which has excellent flexibility and board adhesiveness, together with high thermal resistance and high humidity resistance, tolerates a high temperature treatment at soldering and can be stably used for a long time under a harsh environment with high temperature and vibration in an automobile, as well as to provide an uncured sheet product, an uncured laminate for a circuit board and a cured laminate for the circuit board by the use thereof.

As a result of an extensive study for solving the above problems, the present inventors have found that an electrical insulating resin having an excellent flexibility, adhesiveness, humidity resistance and thermal deterioration resistance can be formed by the following compositions: an electrical insulating resin composition containing a rubber like polymer compound (A) composed of a copolymer of an aromatic vinyl compound and a conjugated diene compound, a polymerizable monomer (B) having one or more terminal reactive double bonds, and an oligomer (C) having a ring structure and having a reactive unsaturated bond in the molecule thereof; and an electrical insulating resin composition containing a partially hydrogenated rubber like polymer compound (D) that is a partial hydrogenation product of the rubber like polymer compound (A) composed of a copolymer of an aromatic vinyl compound and a conjugated diene compound, and a polymerizable monomer (B) having one or more terminal reactive double bonds, as an organic ingredient. The present invention has thus been completed based on this finding.

The electrical insulating resin composition of the present invention may be polymerized utilizing polymerization reaction such as a radical polymerization reaction and other polymerization reaction, and the rubber like polymer compound and the polymerizable monomer are uniformly crosslinked in a resulting reaction product. With the composition consisting of a rubber like polymer compound (A) composed of a copolymer of an aromatic vinyl compound and a conjugated diene compound, a polymerizable monomer (B) having one or more terminal reactive double bonds, upon polymerization of the polymerizable monomer in the rubber like polymer compound, a polymer of the polymerizable monomer grows to become particles, which will be distributed as a discontinuous phase in a continuous phase of the rubber like polymer compound to make a heterogeneous system in some cases. This is likely to reduce thermal deterioration resistance.

On the contrary, in a cured product obtained by adding the oligomer component (C) to the aforementioned two-ingredient system, the oligomer serves as a mutual solubility agent of the rubber like polymer compound and the polymerizable monomer. Thus three components are uniformly polymerized. As a result, no local weight loss on heating at high temperature occurs, and thereby no microvoid occurs in the insulating layer. Therefore, a dielectric strength property after the thermal deterioration may be further improved, and it is possible to use the composition suitably for use in which the thermal resistance is required.

As mentioned above, when the rubber like polymer compound (A) and the polymerizable monomer (B) were polymerized, unsaturated groups of the rubber like polymer compound partially remained in an unreacted state. This unreacted unsaturated group is oxidized at high temperature at the soldering or oxidized/deteriorated when used at high temperature, which has caused deterioration of an insulation performance of the electrical insulating layer. On the contrary, apart from the method of adding an oligomer such as those mentioned above, an oxidative deterioration resistance of the electrical insulating layer due to heating may be significantly improved by leaving a portion of unsaturated groups derived from the conjugated diene compound and hydrogenate the groups prior to the polymerization reaction. Such an effect may be obtained by the combination of a partially hydrogenated rubber like polymer compound (D) that is a partial hydrogenation product of the rubber like polymer compound (A) and a polymerizable monomer (B).

It is desirable that the hydrogenation ratio of the partially hydrogenated rubber like polymer compound (D) is 70% or more.

Adding the oligomer (C) to the combination of the partially hydrogenated rubber like polymer compound (D) and the polymerizable monomer (B), it may be possible to obtain a cured product having a structure in which the three ingredients, i.e. the partially hydrogenated rubber like polymer compound, the oligomer and the polymerizable monomer, are further uniformly polymerzed. Such a composition thus has a further improved thermal resistance life, and therefore may preferably be used for applications which requires thermal resistance.

Further, a circuit board having an excellent thermal conductivity may be obtained by further adding a thermal conductive inorganic filler (E) to the composition for improving the thermal conductivity.

The electrical insulating resin composition of the present invention may preferably be used for forming an electrical insulating layer on a circuit board by forming a layer of the composition on a metal substrate and then curing the layer. Formation of the layer, which will be described in detail later, may be performed by applying the resin composition on a substrate and then drying the layer; or by impregnating a fiber sheet with the resin composition and then drying the sheet.

An uncured sheet product of the present invention is an uncured sheet material used for forming the electrical insulating layer in the circuit board. The uncured sheet product of the present invention may include a uncured sheet obtained by impregnating a fiber sheet with the electrical insulating resin composition of the invention or an adhesive sheet which has an uncured electrical insulating layer formed from the electrical insulating resin composition of the invention formed on a detachable film. The uncured sheet of the invention is an uncured sheet product which gives an electrical insulating layer by being placed on a metal layer (metal conductor foil for a wiring layer or metal substrate) followed by being cured. The adhesive sheet of the invention is an uncured sheet product which gives an electrical insulating layer by peeling the detachable film from an uncured electrical insulating layer, transposing the uncured electrical insulating layer on a metal layer and curing it.

An uncured laminate of the present invention is a laminate used for producing the circuit board. The laminate is composed of an uncured electrical insulating layer obtained from the electrical insulating resin composition of the present invention and a metal layer (metal conductor foil for a wiring layer or metal substrate). That is, the uncured laminate of the invention is used for simultaneously forming the electrical insulating layer and one layer selected from the metal conductive foil for the wiring layer or the metal substrate. Examples of the uncured laminate of the invention may include a laminate having a double layer structure where the uncured electrical insulating layer obtained from the electrical insulating resin composition of the invention is formed on the metal plate which is served as the metal substrate, or a laminate having a double layer structure where the uncured electrical insulating layer obtained from the electrical insulating resin composition of the invention is formed on the metal conductor foil which is served as the wiring layer.

A cured laminate of the present invention is a laminate used for producing a circuit board, and is a laminate having a metal layer (metal conductor foil for a wiring layer or metal substrate) at least on one side of the electrical insulating layer obtained by curing the electrical insulating resin composition. Examples of the cured laminate of the invention may include a cured laminate having a triple layer structure obtained by sequentially laminating the metal substrate, the electrical insulating layer and the metal conductor foil in this order; a cured laminate having a double layer structure obtained by sequentially laminating the metal conductor foil and the electrical insulating layer; and a cured laminate having a triple layer structure obtained by sequentially laminating the metal conductor foil, the electrical insulating layer and the metal conductor foil in this order. The cured laminate having the triple layer structure obtained by sequentially laminating the metal substrate, the electrical insulating layer and the metal conductor foil is utilized for producing the metal based board. The cured laminate having the double layer structure obtained by sequentially laminating the metal conductor foil and the electrical insulating layer, and the cured laminate having the triple layer structure obtained by sequentially laminating the metal conductor foil, the electrical insulating layer and the metal conductor foil are utilized for inner layer circuits of a single sided circuit board, a double sided circuit board and a multilayer circuit board as usual printed wiring plate materials.

In the electrical insulating resin composition of the present invention, i.e. (1) the electrical insulating resin composition containing the rubber like polymer compound (A) composed of a copolymer of an aromatic vinyl compound and a conjugated diene compound, the polymerizable monomer (B) having one or more terminal reactive double bonds, and the oligomer (C) having a ring structure and having a reactive unsaturated bond in the molecule thereof; and (2) the electrical insulating resin composition containing the partially hydrogenated rubber like polymer compound (D) that is the partial hydrogenation product of the rubber like polymer compound (A) composed of a copolymer of an aromatic vinyl compound and a conjugated diene compound and the polymerizable monomer (B) having one or more terminal reactive double bonds, and further containing the oligomer (C), ingredients that are soluble each other are employed. Thus the resulting cured product has a structure in which the ingredients are uniformly polymerized, whereby thermal deterioration resistance may be improved. Thus the present composition may be utilized for applications which requires thermal resistance.

With the aforementioned strategy, the amount of the unreacted unsaturated bonds of the rubber like polymer compound can be significantly reduced. Therefore, the deterioration of the electrical insulating layer caused by oxidation can be significantly improved.

The electrical insulating material obtained using the rubber like polymer compound may keep the flexibility and excellent workability even when the thermal conductive inorganic filler such as alumina is filled for enhancing the thermal radiation. Suitable combination of the resin composition may provide the adhesiveness, the dielectric strength and the flexibility of the electrical insulating material depending on a required property.

The addition of the oligomer which is a solid at ambient temperature may inhibit tackiness, suppress stickiness upon producing the uncured laminate, and improve the working property.

Utilization of the radical polymerization or other manner of the polymerization makes B stage control that is necessary for an epoxy resin unnecessary, storage stability enhance exponentially and handling easy. A curing time for the production of the cured laminate may be shortened to serve for enhancement of productivity and energy saving.

The other objects, features and advantages of the present invention are specifically set forth in or will become apparent from the following detailed descriptions of the invention.

DETAILED DESCRIPTIONS

[I] Electrical Insulating Resin Composition

It is preferable that each of the cured products obtained from the electrical insulating resin composition of the present invention (i.e., (1) the electrical insulating resin composition containing the rubber like polymer compound (A) composed of a copolymer of an aromatic vinyl compound and a conjugated diene compound, the polymerizable monomer (B) having one or more terminal reactive double bonds, and the oligomer (C) having a ring structure and having a reactive unsaturated bond in the molecule thereof; and (2) the electrical insulating resin composition containing the partially hydrogenated rubber like polymer compound (D) that is the partial hydrogenation product of the rubber like polymer compound (A) composed of a copolymer of an aromatic vinyl compound and a conjugated diene compound and the polymerizable monomer (B) having one or more terminal reactive double bonds, and further containing the oligomer (C)) has a flexibility at room temperature. The degree of flexibility at room temperature is preferably 75 or less in terms of D hardness.

As the rubber like polymer compound (A), the copolymer of the aromatic vinyl compound (i) and the conjugated diene compound (ii) is used.

As mentioned above, the copolymer may be replaced by the partially hydrogenated rubber like polymer compound (D), whereby the thermal resistance and the thermal deterioration resistance may be improved.

Specific examples of the aromatic vinyl compound which is a monomer component of (i) may include styrene, α-methylstyrene, p-methylstyrene, vinylpyridine, t-butylstyrene, N,N-diethyl-p-aminoethylstyrene, and divinylbenzene.

Specific examples of the conjugated diene which is a monomer component of (ii) may include 1,3-butadiene, isoprene, 2,3-dimethyl-1,3-butadiene, 1,3-pentadiene, 1,3-hexadiene, 2-methyl-1,3-pentadiene, 4,5-diethyl-1,3-octadiene, 3-butyl-1,3-octadiene, and chloroprene.

The copolymer used as the rubber like polymer compound may be a block copolymer or a random copolymer. In the case of the block copolymer, when a polymer block derived from the monomer component of (i) is designated as "A" and a polymer block derived from the monomer component of (ii) is designated as "B", then the block copolymer represented by A-B-A or A-B may be exemplified.

In the copolymer, when the sum of the monomer component of (i) and the monomer component of (ii) is 100 parts by weight, a percentage of the monomer of (i) is desirably less than 50 parts by weight, and more desirably 10 to 30 pats by weight. The amount less than 50 parts by weight of the monomer component of (i) may assure the elastic modulus, the flexibility and the thermal resistance, and enhance the adhesiveness to the metal layer. It is preferable that a 1,4 bond be a major structure in a polymerization form of the conjugated diene because the flexibility of a resulting cured product is enhanced. It is not preferable that a 1,2-vinyl bond be increased because a rubber property is reduced and the hardness is increased.

Modified compounds obtained by introducing a polar group such as a carboxylic acid group, an acid anhydrate group, an amino group, a hydroxyl group and an epoxy group and a bond such as an urethane bond, an ester bond and an amide bond into the above copolymer may also be used as the rubber like polymer compound (A) of the present invention. The introduction of the polar group, and the bonds such as urethane bond, the ester bond and the amide bond into the above copolymer is preferable because the adhesiveness to the metal layer may be enhanced.

It is preferable that a hydrogenation ratio of the partially hydrogenated polymer compound (D) be 70% or more. When the hydrogenation ratio is less than 70%, a thermal stability and a durability of a resulting insulating layer may possibly be inferior in some cases. In the present invention, the more preferable hydrogenation ratio is 80% or more, and in this range, the insulating material having thermal stability for a long time, which is more excellent in flexibility and adhesiveness is obtained. An upper limit of the hydrogenation ratio of the partially hydrogenated polymer is not particularly limited, but is preferably 99% or less. When the hydrogenation ratio is increased, it is necessary to make a curing condition more stringent by increasing a curing temperature, but the thermal stability of the cured product may be further increased and simultaneously the flexibility and the adhesiveness may also be enhanced.

A molecular weight Mw of the rubber like polymer compound (A) used for the present invention is preferably 30,000 to 300,000, and more preferably 50,000 to 150,000.

In the present invention, the rubber like polymer compound may be used alone, but it is also possible to combine two or more rubber like polymer compounds having a different monomer component ratio and a different molecular weight. The combination of two or more rubber like polymer compounds is preferable because thereby the mutual solubility, the adhesiveness and the flexibility of the electrical insulating resin composition may be controlled.

As the polymerizable monomer (B), a polymerizable monomer having one or more terminal reactive double bonds is used. The polymerizable monomer is a compound having one or more reactive double bonds at the end portion of the molecule, and capable of being cured by the radical polymerization or heat polymerization. Examples of such a compound may include compounds having the double bonds with high reactivity such as vinyl, allyl, metallyl, methacryl and acryl at the end, conjugated diene and non-conjugated diene.

Specific examples of such a polymerizable monomer may include divinylheptane, divinyloctane, divinylnonane, vinylbenzene, divinylbenzene, bisphenol A type epoxy acrylate, methyl methacrylate, isobornyl acrylate, tricyclodecane dimethacrylate, triallyl isocyanurate, ethoxylated isocyanurate triacrylate, butadiene, isobutylene, pentadiene, hexadiene, octadiene, nonadiene, decadiene, dicyclopentadiene, and ethylidene norbornene. In particular, it is preferable to use the monomer which contain a ring structure in the molecule, such as isobornyl acrylate, tricyclodecane dimethacrylate, triallyl isocyanurate, ethoxylated isocyanurate triacrylate, and cyclic aliphatic compounds obtained by hydrogenating an aromatic ring contained in the molecules thereof. The use of the monomer containing a ring, such as a cyclic aliphatic compound, an aromatic compound and a heterocyclic compound, may further enhance the mutual solubility and the thermal resistance.

Furthermore, the introduction of the polar group such as a carboxylic acid group, an amino group, a hydroxyl group and an epoxy group, and the bond such as an urethane bond, an ester bond and an amide bond into the aforementioned polymerizable copolymer is preferable because the adhesiveness to the metal layer may be enhanced.

The molecular weight of the polymerizable monomer is not particularly limited, but the molecular weight Mw thereof is preferably 50 to 500, and more preferably 100 to 350.

The polymerizable monomer is primarily associated with a flow property and a crosslinking reaction in the electrical insulating resin composition, and thus it is necessary to sufficiently consider the mutual solubility depending on the composition used.

As the aforementioned oligomer (C), an oligomer having a ring structure and having a reactive unsaturated bond in the molecule is used. The oligomer contained serves as a mutual solubility agent of the rubber like polymer compound and the polymerizable monomer, and thus, the mutual solubility of the mixture is increased, a homogeneity of a curing reaction is increased and the thermal resistance of a cured product may be enhanced.

The above oligomer is a compound having a ring structure in the molecule, such as an aromatic, cyclic aliphatic or heterocyclic compound. Examples of a cyclic skeleton contained in the oligomer molecule may include coumarone, indene, rosin, cyclopentane, cyclohexane, tricyclodecane, norbornene, isocyanuric acid, and triazine. The oligomer having an alicyclic structure (cyclic aliphatic) such as rosin, cyclopentane, cyclopentene, cyclohexane, cyclohexene, tricyclodecane and norbornene among them is more preferable than the aromatic and heterocyclic oligomers because a mutual solubility effect is higher and the thermal resistance of the cured product may further be enhanced.

As the oligomer used for the present invention, it is possible to use a polymer of a polymerizable monomer having the ring structure, or a copolymer of the polymerizable monomer having the ring structure and an aliphatic unsaturated compound, or an esterified compound thereof.

Specific examples of the compound may include (1) a copolymer of 5-ethylidene-2-norbornene or dicyclopentadiene which is a cyclic aliphatic compound, or styrene or vinyltoluene which is an aromatic vinyl compound, and 1,4-hexadiene, isobutylene, 1,3-pentadiene or a mixture of diene-type unsaturated compounds (so-called C5 fraction of distillate) which is an aliphatic unsaturated compound, (2) a condensation polymer such as a rosin derivative or an esterified compound thereof, (3) a dimer acid and modified compound thereof, (4) a copolymer such as a coumarone indene resin, and (5) a polymer of triallyl isocyanurate, and among them, the compounds of (1) to (3) are more preferable.

The introduction of the polar group such as a carboxylic acid group, an amino group, a hydroxyl group and an epoxy group, and a bond such as an urethane bond, an ester bond and an amide bond into the aforementioned oligomer is preferable because the adhesiveness to the metal layer may be enhanced.

A molecular weight Mw of the oligomer is preferably 300 to 10,000, and more preferably 400 to 1,000. The use of the oligomer having the molecular weight smaller than the rubber like polymer compound and larger than the polymerizable monomer may further increase the mutual solubility of the electrical insulating resin composition.

It is preferable to use the oligomer which is solid at ambient temperature in terms of stable quality, i.e., reduction of the tackiness of the uncured product of the electrical insulating resin composition.

In the present invention, the respective organic components of the electrical insulating resin composition are blended so that the D hardness after being cured is 75 or less. The "D hardness" means a value measured in accordance with a test method of JIS. As used herein, the "organic components" include all organic compounds contained in the electrical insulating resin composition. Thus the organic component also include a polymerization initiator and a variety of additives that will be described later.

In the present invention, the D hardness of 75 or less of the organic components after being cured may lead to an electrical insulating layer having the excellent flexibility, adhesiveness, humidity resistance and thermal deterioration resistance. When the D hardness of the organic components after being cured is more than 75, the flexibility and the adhesiveness to the metal may become insufficient, and eminent addition of the inorganic filler may cause cracking of the electrical insulating layer at a high temperature, which may result in reduction of the dielectric strength. In the present invention, it is more preferable that the D hardness of the organic components after being cured with heat and pressure is 70 or less.

When the addition of the aforementioned oligomer (C) is not considered, preferable ratio of the partially hydrogenated rubber like polymer compound (D) and the polymerizable monomer (B) varies depending on types of the organic components, and thus is difficult to be generally defined. However, it is preferable to blend the component (D) as a major ingredient in order to adjust the D hardness to 75 or less. Specifically, it is preferable to blend the component (D) at 50 to 95 parts by weight and the component (B) at 50 to 5 parts by weight based on the sum 100 parts by weight of the components (D) and (B). When the oligomer is added, it is preferable to contain the component (D) at 50 to 80 parts by weight, the component (B) at 40 to 10 parts by weight and the oligomer component at 40 to 10 parts by weight.

The ratio of the components (D), (B) and (C) is not particularly limited and may be adjusted so that the D hardness of the organic components after being cured is 75 or less. The preferable ratio varies depending on types of the organic components, and thus is difficult to be generally defined. However, it is preferable to blend the component (D) as a major ingredient in order to adjust the D hardness to 75 or less. Specifically, it is preferable to blend the component (D) at 50 parts by weight or more based on the sum 100 parts by weight of the three components. In particular, it is preferable to contain the component (D) at 50 to 80 parts by weight, the component (B) at 40 to 10 parts by weight and the oligomer component at 40 to 10 parts by weight.

In the electrical insulating resin composition of the present invention, it is preferable to add a thermal conductive inorganic filler to enhance a thermal conductivity. Examples of the thermal conductive inorganic filler may include silica, alumina, aluminium nitride, boron nitride, silicon carbide, and silicon nitride. The filler may be blended in accordance with the determined optimal particle size, particle size distribution, shape and amount to be filled. The volume ratio of the thermal conductive inorganic filler may be 40 to 90% by volume, and preferably 50 to 75% by volume based on the volume of the electrical insulating resin composition (including the thermal conductive inorganic filler).

The electrical insulating resin composition of the present invention may be cured by the radical polymerization reaction or other polymerization reaction. Although any manner of reaction may be employed, it is preferable to cure by the radical polymerization reaction. In that case, a radical polymerization initiator is added.

Examples of the radical polymerization initiator may include, but is not limited to, organic peroxides such as diacyl peroxide, alkyl peroxyester, peroxydicarbonate, monoperoxycarbonate, peroxyketal, dialkyl peroxide, hydroperoxide, ketone peroxide, perbenzoic acid, t-butyl peroxide and dicumyl peroxide, and azobis based compounds such as azobisisobutyronitrile and azobis-1-cyclohexanenitrile.

The amount of the radical polymerization initiator to be added may be 0.1 to 10 parts by weight based on 100 parts by weight of the sum of the components (A), (B) and (C) or the sum of the components (D), (B) and (C). It is preferable to add in the range of 1 to 5 parts by weight because a good cured product is obtained.

The adhesive force of the resin composition to inorganic materials such as the thermal conductive inorganic filler, glass cloth and copper foil may be enhanced by previously treating a surface of the inorganic material with a silane based coupling agent typified by epoxysilane, aminosilane and methacryloxysilane or a titanate based or aluminium based coupling agent, or blending such a compound into the electrical insulating resin composition.

When the electrical insulating resin composition is impregnated in the glass cloth, or applied on a support such as a detachable film, a metal conductor foil or a metal substrate, the electrical insulating resin composition of the present invention may be diluted with an organic solvent in order to control the fluidity of the electrical insulating resin composition. Examples of the organic solvent may include methanol, ethanol, propanol, isopropanol, methyl acetate, ethyl acetate, benzene, toluene, xylene, acetone, methylethylketone, diethylether, dioxane, chloroform, carbon tetrachloride, dichloroethane, trichloroethane, and chlorobenzene. One or more of them may appropriately be selected to use.

Additionally, a variety of additives may be added. Examples of the additives may include an ion absorber which inhibits ion migration and an anti-aging agent for preventing the oxidative deterioration. A flame retardant may be added to decrease flammability.

The electrical insulating resin composition may be prepared by uniformly mixing the respective components described in the above.

[II] Cured Laminate for Circuit Board and Materials for Forming the Laminate

The electrical insulating resin composition of the present invention may be used as an electrical insulating material in any publicly known circuit board without limitation, but a metal based board will be mainly illustrated below because the composition is suitably used as the electrical insulating material in the metal based board particularly.

The metal based board of the present invention is a cured laminate made by sequentially laminating a metal substrate, an electrical insulating layer and a metal conductor foil, and characterized in that the electrical insulating layer thereof is composed of a cured product of the electrical insulating resin composition of the present invention. At the use thereof, the circuit board may be formed by giving a general circuit formation processing, e.g., giving an etching treatment on the metal conductor foil on the surface layer. A multilayer circuit board may also be made by further forming an electrical insulating layer and a metal conductor foil on a circuit-formed surface of the circuit board, and giving a circuit forming processing onto the metal conductor foil of the surface layer.

The electrical insulating layer may be made by heat-curing the electrical insulating resin composition by a radical polymerization reaction or other polymerization reaction. A preferable temperature condition for curing is 120 to 250° C.

A method for forming the metal based board of the present invention is not particularly limited. For example, the metal based board may be formed by directly applying the electrical insulating resin composition on a metal substrate, placing a metal conductor foil on an applied film of the electrical insulating resin composition and curing the electrical insulating resin composition with heat and pressure; or by directly applying the electrical insulating resin composition on the metal conductor foil, placing the metal substrate on the applied film of the electrical insulating resin composition and curing the electrical insulating resin composition with heat and pressure. Alternatively, the metal based board may be formed by obtaining a uncured sheet by impregnating a glass cloth with the electrical insulating resin composition, sandwiching the uncured sheet between the metal substrate and the metal conductor foil, and curing the electrical insulating resin composition with heat and pressure. Alternatively, the metal based board may be formed by applying the electrical insulating resin composition on a detachable film to form an uncured electrical insulating layer, peeling the detachable film therefrom, and sandwiching the uncured electrical insulating layer between the metal substrate and the metal conductor foil, and curing the uncured electrical insulating layer with heat and pressure.

Additionally, the electrical insulating resin composition of the present invention may also be used as a cured laminate for the circuit board as described below. For example, the electrical insulating resin composition may be used as the cured laminate for the circuit board obtained by arranging the metal conductor foil on at least one side of the electrical insulating layer composed of the cured product of the electrical insulating resin composition.

The cured laminate for a single sided circuit board formed by arranging the metal conductor foil on one side of the electrical insulating layer may be produced by placing the metal conductor foil on one side of the aforementioned uncured sheet or an adhesive sheet, and then curing it with heat using a heat press. Alternatively, it is also possible to produce by forming the applied film (uncured electrical insulating layer) on the metal conductor foil using the electrical insulating resin composition and then curing it with heat.

The cured laminate for a double sided circuit board formed by arranging the metal conductor foil on both sides of the electrical insulating layer may be obtained by placing the metal conductor foils on both sides of the aforementioned uncured sheet or adhesive sheet or, if the uncured laminate is used, placing the metal conductor foil on the side opposite to the side of the uncured electrical insulating layer on which the metal conductor foil has been formed, and then curing it with heat using a heating press.

A thickness of the electrical insulating layer after being cured is preferably 10 to 300 µm, and in particular, the range of 50 to 150 µm is preferable.

As the metal substrate, metal materials such as aluminium and copper may be used. A thickness of the metal substrate is 0.1 to 5 mm, and preferably 0.5 to 3 mm.

As the metal conductor foil for a wiring layer formation, metal foils of copper and aluminium may be used. A thickness of the metal conductor foil is 5 to 500 µm, and preferably 35 to 300 µm.

Subsequently, materials for forming the cured laminate for the circuit board of the present invention will be illustrated. The forming materials for forming the cured laminate for the circuit board of the present invention may be supplied in a variety of forms, such as (1) an uncured sheet product used for forming the electrical insulating layer in the circuit board, and (2) an uncured laminate having a double layer structure for forming the electrical insulating layer and one layer selected from the metal substrate and the metal conductor foil for the wiring layer in the circuit board. These forming materials are utilized suitably for the production of the metal based board, but the use thereof is not limited thereto.

Examples of the uncured sheet product of (1) may include (i) an uncured sheet and (ii) an adhesive sheet in which the electrical insulating resin composition has been applied to a detachable film to form an uncured electrical insulating layer.

The uncured sheet of (i) is obtained by impregnating a fiber sheet with the electrical insulating resin composition. At the use, the electrical insulating layer is formed by placing the metal conductor foil on one or both sides of the uncured sheet or placing the metal conductor foil on one side of the uncured sheet and the metal substrate on the other side, and then compressing this laminate with heat to cure the electrical insulating resin composition impregnated in the glass cloth. The cured laminate obtained by laminating the metal conductor foils on both sides of the uncured sheet and curing the electrical insulating resin composition may be utilized for an inner layer circuit of a multilayer circuit board.

The fiber sheet used for making the uncured sheet may include organic or inorganic woven fabric or nonwoven fabric. Examples of the inorganic fiber sheet may include glass cloth, glass nonwoven fabric and alumina cloth. Examples of the organic fiber sheet may include cloths and nonwoven fabrics composed of polyamide, polyimide, aramid, thermal resistant polyester, polyphenylsulfide (PPS), polyether ether ketone (PEEK), and carbon fiber.

The uncured sheet may be formed by diluting the electrical insulating resin composition with an organic solvent up to an appropriate concentration, impregnating the glass cloth with this solution, and subsequently drying it. The thickness of the glass cloth is preferably 30 to 200 µm, and more preferably 60 to 100 µm. The adhered amount of the electrical insulating resin composition can be controlled depending on intended use.

The adhesive sheet of (ii) is formed by forming the uncured electrical insulating layer composed of the electrical insulating resin composition of the present invention on the detachable film. At an actual use thereof, the adhesive sheet may be utilized for the metal based board by peeling the detachable film, sandwiching the uncured electrical insulating layer between the metal substrate and the metal conductor foil, and then curing it with heat and pressure. The adhesive sheet may further be utilized as the cured laminate for the inner circuit in the multilayer circuit board by laminating the metal conductor foil on one or both sides and then compressing it with heat.

This adhesive sheet may be obtained by applying the electrical insulating resin composition of the present invention on the detachable film and drying a resulting applied film. This detachable film may be films made of olefins such as polyethylene and polypropylene, a fluorine resin based film, a polyethylene terephthalate film and a triacetylcellulose film. Those having a detachable property imparted by a silicone resin are preferably used. The thickness of the film is preferably 10 to 200 µm, and more preferably 30 to 100 µm.

Examples of the uncured laminate of (2) may include (i) a laminate with a double layer structure in which the uncured electrical insulating layer obtained from the electrical insulating resin composition of the present invention is formed on the metal substrate or (ii) a laminate with a double layer structure where the uncured electrical insulating layer obtained from the electrical insulating resin composition of the present invention is formed on the metal conductor foil which is served as the wiring layer. Such an uncured laminate may be produced by applying the electrical insulating resin composition of the present invention on the metal substrate or the metal conductor foil and drying a resulting applied film.

In the case of the uncured laminate in which the uncured electrical insulating layer is formed on the metal conductor foil, the laminate with triple layer composed of the metal substrate, the electrical insulating layer and the metal conductor foil is formed by placing the uncured electrical insulating layer on the metal substrate, and heating and pressing it to attach the uncured electrical insulating layer to the metal substrate. The cured laminate usable for the inner layer circuit in the multilayer circuit board may be made by further placing the metal conductor foil on the uncured electrical insulating layer, and then compressing it with heat.

In the case of the laminate in which the uncured electrical insulating layer is formed on the metal substrate, the laminate with triple layer in which the metal substrate, the electrical insulating layer and the metal conductor foil are sequentially laminated is formed by placing the metal conductor foil on the uncured electrical insulating layer, and heating and pressing it to attach the electrical insulating layer to the metal conductor foil.

A protection film may be provided if necessary on the aforementioned (1) uncured sheet product and (2) the uncured electrical insulating layer in the uncured laminate described above. The protection film may be peeled to use at the use. The aforementioned detachable film may also be used for the protection film.

EXAMPLES

The present invention will be illustrated in more detail with reference to the following Examples, but the invention is not limited the following Examples.

Example 1

An electrical insulating resin composition was obtained by dissolving 60 parts by weight of an epoxy-modified SBS block copolymer (A1) (styrene/butadiene=40/60, oxirane oxygen concentration: 1.5% by weight, molecular weight: about 100,000, MFR: 7 g/10 min. (190° C., 2.16 kgf)) as a rubber like polymer compound A, 20 parts by weight of a dicyclopentadiene based petroleum resin (C1) (iodine number=190, softening point=145° C.) as an oligomer C, and 20 parts by weight of tricyclodecane dimethanol dimethacrylate (B1) as a monomer B in 130 parts by weight of toluene, subsequently adding 2.7 parts by weight of an acryl based silane coupling agent and 3.0 parts by weight of a radical initiator (dicumyl peroxide), and kneading the mixture.

The resulting electrical insulating resin composition was applied to one side of copper foil with an thickness of 35 μm using a bar coater, and subsequently the solvent was evaporated by drying in an oven heated at 80° C. for 10 min. to make an electrical insulating layer with an thickness of 100 μm. Then, the electrical insulating layer applied on the copper foil was overlaid on an aluminium substrate with an thickness of 1.0 mm, which was then cured with heat and pressure using a heating press at 180° C. at 5 MPa for 30 min. to make a cured laminate plate composed of the aluminium substrate, the electrical insulating layer and the copper foil.

Example 2

An electrical insulating resin composition was prepared in the same way as in Example 1, except for changing the amount of the rubber like polymer compound A1 to 70 parts by weight, the amount of the oligomer C1 to 10 parts by weight and the amount of the monomer B1 to 20 parts by weight. Using the resulting electrical insulating resin composition, a cured laminate plate composed of the aluminium substrate, the electrical insulating layer and the copper foil was made in the same way as in Example 1.

Comparative Example 1

An electrical insulating resin composition was prepared in the same way as in Example 1, except for changing the amount of the rubber like polymer compound A1 to 40 parts by weight, the amount of the oligomer C1 to 30 parts by weight and the amount of the monomer B1 to 30 parts by weight. Using the resulting electrical insulating resin composition, a cured laminate plate composed of the aluminium substrate, the electrical insulating layer and the copper foil was made in the same way as in Example 1.

The cured laminate plates in Examples 1 and 2 and Comparative Example 1 (no inorganic filler) were evaluated in accordance with the following evaluation methods. Results are shown in Table 1.

<D Hardness>

The D hardness of the electrical insulating layer after being cured with heat and pressure was measured in accordance with JIS K7215 "testing method for durometer hardness of plastics" using Type D (supplied from Ueshima Seisakusho Co., Ltd.) of a durometer defined in the testing method.

<T Peel Strength Test>

A sample having a pattern with a width of 10 mm formed by etching the copper foil of the laminate plate was made, and a T peel strength (N/cm) when the copper foil was peeled at a velocity of 50 mm/min. toward a perpendicular direction to the substrate was measured. The T peel strength was also measured for a sample deteriorated at high temperature obtained by placing the sample in an oven at 220° C. for 5 days. A retention rate was calculated from the T peel strength after the deterioration at high temperature and that in an A state (state before the deterioration).

Retention rate (%)=(T peel strength after deterioration at high temperature/T peel strength in A state)×100

<Solder Temperature Resistance Test>

A sample was made by removing copper foil at 25×50 mm on a laminate plate of 50×50 mm, the sample was floated in a solder bath at 300° C., and a time period until a change such as swelling was visually observed was measured.

TABLE 1

| | | (Without filler) | | |
|---|---|---|---|---|
| | | Example 1 | Example 2 | Comp. Ex. 1 |
| Polymer | A1 | 60 | 70 | 40 |
| Oligomer | C1 | 20 | 10 | 30 |
| Monomer | B1 | 20 | 20 | 30 |
| D hardness | State A | 67 | 64 | 82 |
| T-Peel | State A | 18.1 | 18.5 | 16.7 |

TABLE 1-continued (Without filler)

|  |  | Example 1 | Example 2 | Comp. Ex. 1 |
|---|---|---|---|---|
| strength (N/cm) | Deterioration at high temperature | 16.5 | 17.2 | 13.1 |
|  | Retention rate | 91 | 93 | 78 |
| Solder temperature resistance | 300° C. | 4 min. or more | 4 min. or more | 3 min. |
| General evaluation |  | Good | Good | Bad |

State A: Untreated state before the deterioration
A1: Epoxy-modified SBS block copolymer
A2: SBS block copolymer (without epoxy modification)
C1: Dicyclopentadiene based petroleum resin
C2: Petroleum resin composed of copolymers of cyclopentadiene with C5 and C9 fractions
B1: Tricyclodecane dimethanol dimethacrylate As shown in Table 1, in the electrical insulating layer in Comparative Example 1, the D hardness is more than 75, which does not meet a standard of the flexibility required in the present invention. Thus, as is evident from the T peel strength test, the adhesiveness to the substrate is inferior compared to those in Examples 1 and 2. As is also shown in the solder temperature resistance test, the thermal resistance is also inferior. From these results, it is found that it is an important condition to blend the organic components so that the D hardness after being cured is 75 or less.

Example 3

Organic components were prepared by dissolving 50 parts by weight of an epoxy-modified SBS block copolymer (A1) (styrene/butadiene=40/60, oxirane oxygen concentration: 1.5% by weight, molecular weight: about 100,000, MFR: 7 g/10 min. (190° C. 2.16 kgf)) as a rubber like polymer compound A, 5 parts by weight of a dicyclopentadiene based petroleum resin (C1) (iodine number=190, softening point=145° C.) as an oligomer C, and 45 parts by weight of tricyclodecane dimethanol dimethacrylate (B1) as a monomer B in 130 parts by weight of toluene, subsequently adding 2.7 parts by weight of an acryl based silane coupling agent and 3.0 parts by weight of a radical initiator (dicumyl peroxide), and kneading the mixture. Then, an electrical insulating resin composition was prepared by adding 60% by volume of a thermal conductive inorganic filler E (alumina, average particle size: 10 μm, BET specific surface area: 2.0 m²/g) to 40% by volume of the organic components, and stirring the mixture for 5 min. by a centrifugation defoaming stirrer.

Using the resulting electrical insulating resin composition, a cured laminate plate composed of three layers of the aluminium substrate, the electrical insulating layer and the copper foil was made in the same way as in Example 1.

Example 4

An electrical insulating resin composition was prepared in the same way as in Example 3, except for changing the amount of the rubber like polymer compound A1 to 60 parts by weight, the amount of the oligomer C1 to 20 parts by weight and the amount of the monomer B1 to 20 parts by weight when organic components were prepared. Using the resulting electrical insulating resin composition, a cured laminate plate composed of three layers of the aluminium substrate, the electrical insulating layer and the copper foil was made in the same way as in Example 1.

Example 5

An electrical insulating resin composition was prepared in the same way as in Example 4, except for using an SBS block copolymer (A1) (styrene/1,4-butadiene=30/70, molecular weight: 120,000, MFR: 6 g/10 min (200° C., 49.0N) as the rubber like polymer compound A when organic components were prepared. Using the resulting electrical insulating resin composition, a cured laminate plate composed of three layers of the aluminium substrate, the electrical insulating layer and the copper foil was made in the same way as in Example 1.

Example 6

An electrical insulating resin composition was prepared in the same way as in Example 3, except for changing the amount of the rubber like polymer compound A1 to 70 parts by weight, the amount of the oligomer C1 to 15 parts by weight and the amount of the monomer B1 to 15 parts by weight when organic components were prepared. Using the resulting electrical insulating resin composition, a cured laminate plate composed of three layers of the aluminium substrate, the electrical insulating layer and the copper foil was made in the same way as in Example 1.

Example 7

An electrical insulating resin composition was prepared in the same way as in Example 4, except for using an oligomer C2 (petroleum resin composed of copolymers of cyclopentadiene with C5 and C9 fractions, bromine number=50, softening point=60° C., average molecular weight=800) in place of the oligomer C1 when organic components were prepared. Using the resulting electrical insulating resin composition, a cured laminate plate composed of three layers of the aluminium substrate, the electrical insulating layer and the copper foil was made in the same method as in Example 1.

Comparative Example 2

Organic components were prepared by dissolving 50 parts by weight of the epoxy-modified SBS block copolymer A1 (styrene/butadiene=40/60, oxirane oxygen concentration: 1.5% by weight, molecular weight: about 100,000, MFR: 7 g/10 min (190° C.)) as a rubber like polymer compound A, and 50 parts by weight of tricyclodecane dimethanol dimethacrylate (B1) as a monomer B in 130 parts by weight of toluene, subsequently adding 2.7 parts by weight of the acryl based silane coupling agent and 3.0 parts by weight of the radical initiator (dicumyl peroxide), and kneading the mixture. Then, an electrical insulating resin composition was prepared by adding 60% by volume of the thermal conductive inorganic filler E (alumina, average particle size: 10 μm, BET specific surface area: 2.0 m²/g) to 40% by volume of the organic components, and stirring the mixture for 5 min. by the centrifugation defoaming stirrer.

Using the resulting electrical insulating resin composition, a cured laminate plate composed of three layers of the aluminium substrate, the electrical insulating layer and the copper foil was made in the same way as in Example 1.

Comparative Example 3

An electrical insulating resin composition was prepared in the same way as in Comparative Example 2, except for changing the amount of the rubber like polymer compound A1 to 70 parts by weight and the amount of the monomer B1 to 30 parts by weight when the organic components were prepared. Using the resulting electrical insulating resin composition, a cured laminate plate composed of three layers of the aluminium substrate, the electrical insulating layer and the copper foil was made in the same way as in Example 1.

For the cured laminate plates in Examples 3 to 7 and Comparative Examples 2 and 3 (inorganic filler was added), the T peel strength test and the solder test were carried out in the same way as in Examples 1 and 2 and Comparative Example 1. A dielectric strength test was further performed in accordance with the following evaluation method. The results are shown in Table 2.

<Dielectric Strength Test>

A sample having a copper foil land having a diameter of 20 mm formed by etching the copper foil on the laminate plate was made. A sample deteriorated at high temperature was also made by placing the sample in an oven at 220° C. for 5 days, and a sample deteriorated with solder was also made by floating the sample in a solder bath at 300° C. for 2 min. A dielectric strength was measured for the samples in an A state (state before giving the deterioration treatment), after the deterioration at high temperature and after the deterioration in the solder bath. The dielectric strength was measured by starting at 1 kV and increasing the voltage by 500 V every 20 sec., and a dielectric strength value was determined as a value obtained by subtracting 500 V from the voltage at which dielectric breakdown occurred.

TABLE 2

(With fillers)

| | | Ex. 3 | Ex. 4 | Ex. 5 | Ex. 6 | Ex. 7 | Comp. Ex. 2 | Comp. Ex. 3 |
|---|---|---|---|---|---|---|---|---|
| Polymer | A1 | 50 | 60 | — | 70 | 60 | 50 | 70 |
| | A2 | — | — | 60 | — | — | — | — |
| Oligomer | C1 | 5 | 20 | 20 | 15 | — | — | — |
| | C2 | — | — | — | — | 20 | — | — |
| Monomer | B1 | 45 | 20 | 20 | 15 | 20 | 50 | 30 |
| Filler | Alumina | 60% | 60% | 60% | 60% | 60% | 60% | 60% |
| T-Peel Strength (N/cm) | State A | 9.8 | 10.3 | 11.8 | 10.2 | 9.7 | 10 | 10 |
| | Deterioration at high temperature | 10.4 | 10.2 | 11.5 | 10.7 | 9.3 | 9 | 9 |
| | Retention rate | 106 | 99 | 97 | 105 | 96 | 90 | 90 |
| Solder temperature resistance | 300° C. | 4 min. or more | 4 min. or more | 4 min. or more | 4 min. or more | 4 min. or more | 3 min. | 3 min. |
| Dielectric strength (kV) in terms of 100 μm | State A | 4.6 | 4.8 | 5.1 | 4.7 | 5.2 | 5 | 5 |
| | Deterioration by Soldering | 4.4 | 4.3 | 4.0 | 4.1 | 5.3 | 1 | 1 |
| | Deterioration at high temperature | 2.6 | 4.9 | 4.0 | 4.4 | 5.2 | — | — |
| General evaluation | | Good | Good | Good | Good | Good | Bad | Bad |

State A: Untreated state before the deterioration
A1: Epoxy-modified SBS block copolymer
A2: SBS block copolymer (without epoxy modification)
C1: Dicyclopentadiene based petroleum resin
C2: Petroleum resin composed of copolymers of cyclopentadiene with C5 and C9 fractions
B1: Tricyclodecane dimethanol dimethacrylate As is evident from the T peel strength test, in Examples 3 to 7, even when the deterioration treatment at high temperature was given, the T peel strength was scarcely reduced, indicating that the electrical insulating layer is highly adhesive to the substrate. On the contrary, in Comparative Examples 2 and 3, since no oligomer was contained, the adhesiveness of the electrical insulating layer to the substrate was reduced due to the deterioration treatment at high temperature.

Also in Examples 3 to 7, even when the deterioration treatment at high temperature or the deterioration treatment with solder was given, the dielectric strength was scarcely reduced, indicating high insulating reliability. On the contrary, in Comparative Examples 2 and 3, the dielectric strength was remarkably reduced after the deterioration treatment with solder. The dielectric breakdown occurred before measuring the dielectric strength by giving the deterioration treatment at high temperature, and the dielectric strength was not measurable.

Using the partially hydrogenated rubber like polymer compounds D1, D2, D3 and D4 described in the following Table 3, electrical insulating resin compositions in Examples 8 to 13 and Comparative Examples 4 and 5 were prepared.

TABLE 3

| Symbol | Classification | MFR g/10 min. | Monomer composition | Hydrogenation ratio | Molecular weight |
|---|---|---|---|---|---|
| D1 | Partially-hydrogenated epoxy-modified styrene/butadiene copolymer | 8 (230° C.) | St/(EB/Bd) 20/(56/24) | 70% | $10 \times 10^4$ |
| D2 | Non-hydrogenated epoxy-modified styrene/butadiene copolymer | 7 (190° C.) | St/(EB/Bd) 40/(0/60) | 0% | $10 \times 10^4$ |
| D3 | Partially-hydrogenated styrene/butadiene copolymer | 140 (230° C.) | St/(EB/Bd) 30/(69/1) | 98% | $5 \times 10^4$ |
| D4 | Partially-hydrogenated acid anhydride-added styrene/butadiene copolymer | 5 (230° C.) | St/(EB/Bd) 30/(69/1) | 98% | $5 \times 10^4$ |

St: Styrene
EB: Ethylene-butylene
Bd: Butadiene

Example 8

An electrical insulating resin composition was prepared by dissolving 70 parts by weight of the partially hydrogenated rubber like polymer compound D3 described in Table 3 and 30 parts by weight of the monomer B1 (tricyclodecane dimethanol dimethacrylate) in 100 parts by weight of toluene, subsequently adding 2.7 parts by weight of the acryl based silane coupling agent and 3.0 parts by weight of the radical initiator (dicumyl peroxide), and kneading the mixture.

The resulting electrical insulating resin composition was applied to one side of the copper foil with an thickness of 35 µm using a bar coater, and then the solvent was evaporated by drying in an oven heated at 80° C. for 10 min. to make an electrical insulating layer of 100 µm. Then the electrical insulating layer applied on the copper foil was overlaid on the aluminium substrate, which was then cured with heat at 180° C. and pressure at 5 MPa for 30 min. using a heat press to make a laminate plate composed of three layers of the aluminium substrate, the electrical insulating layer and the copper foil.

Example 9

An electrical insulating resin composition was prepared by dissolving 60 parts by weight of the partially hydrogenated rubber like polymer compound D1 described in Table 3, 20 parts by weight of the oligomer C1 (dicyclopentadiene based petroleum resin, iodine number=190, softening point=145° C., molecular weight: 400) and 20 parts by weight of the monomer B1 (tricyclodecane dimethanol dimethacrylate) in 100 parts by weight of toluene, subsequently adding 2.7 parts by weight of the acryl based silane coupling agent and 3.0 parts by weight of the radical initiator (dicumyl peroxide), and kneading the mixture. Using the resulting electrical insulating resin composition, a laminate plate composed of three layer of the aluminium substrate, the electrical insulating layer and the copper foil was made in the same way as in Example 1.

Example 10

Organic components were prepared by dissolving 70 parts by weight of the partially hydrogenated rubber like polymer compound D4 described in Table 3 and 30 parts by weight of the monomer B1 (tricyclodecane dimethanol dimethacrylate) in 130 parts by weight of toluene, subsequently adding 2.7 parts by weight of the acryl based silane coupling agent and 3.0 parts by weight of the radical initiator (dicumyl peroxide), and kneading the mixture. Then, an electrical insulating resin composition was prepared by adding 60% by volume of the thermal conductive inorganic filler E (alumina, average particle size: 10 µm, BET specific surface area: 2.0 m$^2$/g) to 40% by volume of the organic components, and stirring the mixture for 5 min. by the centrifugation defoaming stirrer. Using the resulting electrical insulating resin composition, a laminate plate composed of three layer of the aluminium substrate, the electrical insulating layer and the copper foil was made in the same way as in Example 1.

Example 11

Organic components were prepared by dissolving 60 parts by weight of the partially hydrogenated rubber like polymer compound (D4) described in Table 3, 20 parts by weight of the oligomer C3 (alicyclic based hydrocarbon resin, bromine number=55, softening point=140° C., molecular weight: 500) and 20 parts by weight of the monomer B1 (tricyclodecane dimethanol dimethacrylate) in 130 parts by weight of toluene, subsequently adding 2.7 parts by weight of the acryl based silane coupling agent and 3.0 parts by weight of the radical initiator (dicumyl peroxide), and kneading the mixture. Then, an electrical insulating resin composition was prepared by adding 60% by volume of the thermal conductive inorganic filler E (alumina, average particle size: 10 μm, BET specific surface area: 2.0 m²/g) to 40% by volume of the organic components, and stirring the mixture for 5 min. by the centrifugation defoaming stirrer. Using the resulting electrical insulating resin composition, a laminate plate composed of three layer of the aluminium substrate, the electrical insulating layer and the copper foil was made in the same way as in Example 1.

Example 12

Organic components were prepared by dissolving 70 parts by weight of the partially hydrogenated rubber like polymer compound D1 described in Table 3 and 30 parts by weight of the monomer B2 (triallyl isocyanurate) in 130 parts by weight of toluene, subsequently adding 2.7 parts by weight of the acryl based silane coupling agent and 3.0 parts by weight of the radical initiator (dicumyl peroxide), and kneading the mixture. Then, an electrical insulating resin composition was prepared by adding 60% by volume of the thermal conductive inorganic filler E (alumina, average particle size: 10 μm, BET specific surface area: 2.0 m²/g) to 40% by volume of the organic components, and stirring the mixture for 5 min. by the centrifugation defoaming stirrer. Using the resulting electrical insulating resin composition, a laminate plate composed of three layer of the aluminium substrate, the electrical insulating layer and the copper foil was made in the same way as in Example 1.

Example 13

Organic components were prepared by dissolving 60 parts by weight of the partially hydrogenated rubber like polymer compound D1 described in Table 3, 20 parts by weight of the oligomer C1 (dicyclopentadiene based petroleum resin, iodine number=190, softening point=145° C., molecular weight: 400) and 20 parts by weight of the monomer B1 (tricyclodecane dimethanol dimethacrylate) in 130 parts by weight of toluene, subsequently adding 2.7 parts by weight of the acryl based silane coupling agent and 3.0 parts by weight of the radical initiator (dicumyl peroxide), and kneading the mixture. Then, an electrical insulating resin composition was prepared by adding 60% by volume of the thermal conductive inorganic filler E (alumina, average particle size: 10 μm, BET specific surface area: 2.0 m²/g) to 40% by volume of the organic components, and stirring the mixture for 5 min. by the centrifugation defoaming stirrer. Using the resulting electrical insulating resin composition, a laminate plate composed of three layer of the aluminium substrate, the electrical insulating layer and the copper foil was made in the same way as in Example 1.

Comparative Example 4

An electrical insulating resin composition was prepared by dissolving 70 parts by weight of the partially hydrogenated rubber like polymer compound D2 described in Table 3 and 30 parts by weight of the monomer B1 (tricyclodecane dimethanol dimethacrylate) in 130 parts by weight of toluene, subsequently adding 2.7 parts by weight of the acryl based silane coupling agent and 3.0 parts by weight of the radical initiator (dicumyl peroxide), and kneading the mixture. Using the resulting electrical insulating resin composition, a laminate plate composed of three layer of the aluminium substrate, the electrical insulating layer and the copper foil was made in the same way as in Example 1.

Comparative Example 5

An electrical insulating resin composition was prepared by dissolving 70 parts by weight of the partially hydrogenated rubber like polymer compound D2 described in Table 3 and 30 parts by weight of the monomer (B1) (tricyclodecane dimethanol dimethacrylate) in 130 parts by weight of toluene, subsequently adding 2.7 parts by weight of the acryl based silane coupling agent and 3.0 parts by weight of the radical initiator (dicumyl peroxide), and kneading the mixture. Then, an electrical insulating resin composition was prepared by adding 60% by volume of the thermal conductive inorganic filler E (alumina, average particle size: 10 μm, BET specific surface area: 2.0 m²/g) to 40% by volume of the organic components, and stirring the mixture for 5 min. by the centrifugation defoaming stirrer. Using the resulting electrical insulating resin composition, a laminate plate composed of three layer of the aluminium substrate, the electrical insulating layer and the copper foil was made in the same method as in Example 1.

The laminate plates in Examples 8 to 13 and Comparative Examples 4 and 5 were evaluated in accordance with the following evaluation methods. The results are shown in Table 4.

<T Peel Strength Test>

A sample having a pattern with a width of 10 mm formed by etching the copper foil of the laminate plate was made, and the T peel strength (N/cm) when the copper foil was peeled at a velocity of 50 mm/min. toward a perpendicular direction to the substrate was measured.

<Solder Temperature Resistance Test>

Samples were made by removing the copper foil at 25×50 mm on laminate plates of 50×50 mm made under different curing temperature conditions at 180° C. and 220° C., the sample was floated in a solder bath at 300° C., and a time period until a change such as swelling and cracking was visually observed was measured.

TABLE 4

|  |  | Ex. 8 | Ex. 9 | Ex. 10 | Ex. 11 | Ex. 12 | Ex. 13 | Comp. Ex. 4 | Comp. Ex. 5 |
|---|---|---|---|---|---|---|---|---|---|
| Rubber like polymer compound | D1 | — | 60 | — | — | 70 | 60 | — | — |
|  | D2 | — | — | — | — | — | — | 70 | 70 |
|  | D3 | 70 | — | — | — | — | — | — | — |
|  | D4 | — | — | 70 | 60 | — | — | — | — |
| Oligomer | C1 | — | 20 | — | — | — | 20 | — | — |
|  | C2 | — | — | — | 20 | — | — | — | — |

TABLE 4-continued

|  |  | Ex. 8 | Ex. 9 | Ex. 10 | Ex. 11 | Ex. 12 | Ex. 13 | Comp. Ex. 4 | Comp. Ex. 5 |
|---|---|---|---|---|---|---|---|---|---|
| Monomer | B1 | 30 | 20 | 30 | 20 | — | 20 | 30 | 30 |
|  | B2 | — | — | — | — | 30 | — | — | — |
| Filler | Alumina | 0% | 0% | 60% | 60% | 60% | 60% | 0% | 60% |
| Solder temperature resistance 300° C. (min.) | Curing temperature (180° C.) | 4 | 4 | 4 | 6 | 4 | 6 | 4 | <2 |
|  | Curing temperature (220° C.) | 4 | 8 | 10 | 10 | 10 | 10< | <1 | 4 |
| T-Peel strength | (N/cm) | 15 | 18 | 15 | 18 | 18 | 20 | 13 | 10 |

In Examples 8 to 13 in which the partially hydrogenated polymer was used, the T peel strength was high and the electrical insulating layer was highly adhesive to the substrate. On the contrary, in Comparative Examples 4 and 5 in which the non-hydrogenated polymer was used, the adhesiveness was inferior compared to Examples.

In the solder temperature resistance test, in Examples 8 to 13 in which the partially hydrogenated polymer was used, solder temperature resistance for 4 min or more was observed for the samples cured at 180° C. and 220° C. On the contrary, in Comparative Examples 4 and 5 in which the non-hydrogenated polymer was used, the solder temperature resistance for 4 minutes was different depending on the curing temperature condition, and was accomplished only in either condition. Cracking was also likely to easily occur. From these results, it can be speculated that a curing reaction excessively progressed because many butadiene moieties existed in the polymer in Comparative Examples 4 and 5 in which the non-hydrogenated polymer was used. Thus, it is shown that the cured product having well-balanced thermal resistance and flexibility was obtained by the use of the partially hydrogenated polymer.

INDUSTRIAL APPLICABILITY

As in the above, the electrical insulating resin composition according to the present invention has the excellent flexibility, adhesiveness and humidity resistance as well as thermal deterioration resistance capable of withstanding the treatment with high temperature at soldering of parts, is stably usable under the harsh environment of high temperature/humidity for a long time, therefore is useful for as the electrical insulating material in the circuit board such as printed wiring assembly, and in particular may be utilized suitably for the circuit board of electronic devices used under high temperature and vibration conditions such as electronic devices mounted for the use with high heating value such as inverters of an air conditioner and a motor for industry, and an engine room of an automobile.

Although the present invention has been described with reference to the preferred examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims along with their full scope of equivalents.

What is claimed is:

1. A laminate for a circuit board comprising:
   an electrical insulating layer obtained by curing an electrical insulating resin composition; and
   metal layers on both sides of said electrical insulating layer, one of said metal layers being a metal substrate, and the other metal layer being a metal foil for forming wiring;
   wherein said electrical insulating resin composition comprises:
   a partially hydrogenated rubber polymer compound (D) that is a partial hydrogenation product of a rubber polymer compound (A) composed of a copolymer of an aromatic vinyl compound and a conjugated diene compound, said compound (A) having a molecular weight Mw of 30,000 to 300,000;
   a polymerizable monomer (B) having one or more terminal reactive double bonds and having a molecular weight Mw of 100-350;
   an oligomer (C) having an alicyclic ring structure and having a reactive unsaturated bond in the molecule thereof and having a molecular weight Mw of 400-1000, wherein said oligomer (C) is selected from the group consisting of:
   a dicyclopentadiene petroleum resin; and
   a copolymer of a compound selected from the group consisting of 5-ethylidene-2-norbornene, and dicyclopentadiene, and a compound selected from 1,4-hexadiene, isobutylene, 1,3-pentadiene, and a mixture of C5 distillate fraction diene unsaturated compounds;
   a thermal conductive inorganic filler (E),
   an organic peroxide; and,
   a solvent;
   wherein the content of said thermal conductive inorganic filler (E) in said composition ranges from 40 to 90 vol %.

2. The laminate for a circuit board according to claim 1 wherein said electrical insulating layer has flexibility at room temperature.

3. The laminate for a circuit board according to claim 2 wherein said flexibility at room temperature is 75 or less in terms of D hardness.

4. The laminate for a circuit board according to claim 3 wherein said composition contains said partially hydrogenated rubber polymer compound (D) at 50 to 80 parts by weight, said polymerizable monomer (B) at 40 to 10 parts by weight and said oligomer (C) at 40 to 10 parts by weight whereby said flexibility at room temperature being 75 or less in terms of D hardness is obtained.

5. The laminate for a circuit board according to claim 1 wherein the partial hydrogenation ratio of said partially hydrogenated rubber polymer compound (D) is 70% or more.

6. The laminate for a circuit board according to claim 5 wherein said electrical insulating layer has flexibility at room temperature.

7. The laminate for a circuit board according to claim 6 wherein said flexibility at room temperature is 75 or less in terms of D hardness.

8. The laminate for a circuit board according to claim 7 wherein said composition contains said partially hydrogenated rubber polymer compound (D) at 50 to 80 parts by weight, said polymerizable monomer (B) at 40 to 10 parts by weight and said oligomer (C) at 40 to 10 parts by weight whereby said flexibility at room temperature being 75 or less in terms of D hardness is obtained.

* * * * *